United States Patent
Aoki et al.

(10) Patent No.: US 12,142,617 B2
(45) Date of Patent: Nov. 12, 2024

(54) ELECTRONIC DEVICE

(71) Applicant: Semiconductor Energy Laboratory Co., Ltd., Atsugi (JP)

(72) Inventors: Takeshi Aoki, Kanagawa (JP); Yoshiyuki Kurokawa, Kanagawa (JP); Takayuki Ikeda, Kanagawa (JP); Hikaru Tamura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/232,424

(22) Filed: Aug. 10, 2023

(65) Prior Publication Data

US 2024/0006424 A1 Jan. 4, 2024

Related U.S. Application Data

(60) Continuation of application No. 17/893,247, filed on Aug. 23, 2022, now Pat. No. 11,728,354, which is a (Continued)

(30) Foreign Application Priority Data

Sep. 6, 2010 (JP) .................................. 2010-198928

(51) Int. Cl.
*H01L 27/146* (2006.01)
*G09G 3/36* (2006.01)
*H01L 29/786* (2006.01)

(52) U.S. Cl.
CPC ..... *H01L 27/14603* (2013.01); *G09G 3/3648* (2013.01); *H01L 27/14612* (2013.01);
(Continued)

(58) Field of Classification Search
CPC ......... H01L 27/14603; H01L 27/14612; H01L 27/14616; H01L 27/14625;
(Continued)

(56) References Cited

U.S. PATENT DOCUMENTS 5,375,095 A 12/1994 Yamada et al.
5,867,440 A 2/1999 Hidaka
(Continued)

FOREIGN PATENT DOCUMENTS

EP 1122792 A 8/2001
EP 1569277 A 8/2005
(Continued)

*Primary Examiner* — Charles S Chang
(74) *Attorney, Agent, or Firm* — Fish & Richardson P.C.

(57) ABSTRACT

An object is to provide a pixel structure of a display device including a photosensor which prevents changes in an output of the photosensor and a decrease in imaging quality. The display device has a pixel layout structure in which a shielding wire is disposed between an FD and an imaging signal line (a PR line, a TX line, or an SE line) or between the FD and an image-display signal line in order to reduce or eliminate parasitic capacitance between the FD and a signal line for the purpose of suppressing changes in the potential of the FD. An imaging power supply line, image-display power supply line, a GND line, a common line, or the like whose potential is fixed, such as a common potential line, is used as a shielding wire.

13 Claims, 9 Drawing Sheets

Related U.S. Application Data continuation of application No. 17/223,248, filed on Apr. 6, 2021, now Pat. No. 11,430,820, which is a continuation of application No. 16/902,124, filed on Jun. 15, 2020, now Pat. No. 11,239,268, which is a continuation of application No. 16/161,209, filed on Oct. 16, 2018, now Pat. No. 10,685,992, which is a continuation of application No. 14/990,934, filed on Jan. 8, 2016, now Pat. No. 10,109,661, which is a division of application No. 13/224,655, filed on Sep. 2, 2011, now Pat. No. 9,252,171.

(52) U.S. Cl.
CPC .. *H01L 27/14616* (2013.01); *H01L 27/14625* (2013.01); *H01L 27/14636* (2013.01); *H01L 27/14641* (2013.01); *H01L 27/14643* (2013.01); *H01L 29/7869* (2013.01); *G09G 2354/00* (2013.01)

(58) Field of Classification Search
CPC ......... H01L 27/14641; H01L 27/14643; H01L 29/7869; G09G 3/3648; G09G 2354/00
USPC .......................................................... 349/48
See application file for complete search history.

(56) References Cited

U.S. PATENT DOCUMENTS

| | | |
|---|---|---|
| 6,317,353 B1 | 11/2001 | Ikeda et al. |
| 6,483,763 B2 | 11/2002 | Uchikoba et al. |
| 6,512,279 B2 | 1/2003 | Kaifu et al. |
| 6,714,178 B2 | 3/2004 | Koyama et al. |
| 6,747,638 B2 | 6/2004 | Yamazaki et al. |
| 7,026,625 B2 | 4/2006 | Nomura et al. |
| 7,557,847 B2 | 7/2009 | Okita et al. |
| 7,601,984 B2 | 10/2009 | Sano et al. |
| 7,973,863 B2 | 7/2011 | Takama et al. |
| 7,999,259 B2 | 8/2011 | Ikeda et al. |
| 8,068,158 B2 | 11/2011 | Ohtsuki |
| 8,089,476 B2 | 1/2012 | Ishiguro et al. |
| 8,125,580 B2 | 2/2012 | Takama et al. |
| 8,134,190 B2 | 3/2012 | Okita et al. |
| 8,134,625 B2 | 3/2012 | Abe et al. |
| 8,169,572 B2 | 5/2012 | Yamanaka et al. |
| 8,345,137 B2 | 1/2013 | Shinohara et al. |
| 8,440,954 B2 | 5/2013 | Masaaki |
| 8,558,974 B2 | 10/2013 | Takama et al. |
| 8,570,413 B2 | 10/2013 | Matsui et al. |
| 8,587,755 B2 | 11/2013 | Nakajima et al. |
| 8,593,443 B2 | 11/2013 | Maeda et al. |
| 8,674,971 B2 | 3/2014 | Kobashi |
| 8,803,791 B2 | 8/2014 | Sugita et al. |
| 9,069,412 B2 | 6/2015 | Tanaka et al. |
| 9,123,613 B2 | 9/2015 | Brown et al. |
| 9,184,208 B2 | 11/2015 | Kobayashi et al. |
| 2002/0011972 A1 | 1/2002 | Yamazaki et al. |
| 2005/0237405 A1* | 10/2005 | Ohkawa ............ H01L 27/14609 348/308 |
| 2006/0108636 A1 | 5/2006 | Sano et al. |
| 2008/0259051 A1 | 10/2008 | Ota |
| 2009/0027371 A1 | 1/2009 | Lin et al. |
| 2009/0146967 A1 | 6/2009 | Ino et al. |
| 2009/0179199 A1 | 7/2009 | Sano et al. |
| 2009/0201406 A1 | 8/2009 | Okita et al. |
| 2009/0207332 A1 | 8/2009 | Zhang et al. |
| 2009/0268132 A1 | 10/2009 | Takama et al. |
| 2010/0053142 A1 | 3/2010 | Watanabe |
| 2010/0134735 A1 | 6/2010 | Nakamura et al. |
| 2010/0220275 A1 | 9/2010 | Jung et al. |
| 2010/0295756 A1 | 11/2010 | Yoshida et al. |
| 2011/0018850 A1 | 1/2011 | Uehata et al. |
| 2011/0175833 A1 | 7/2011 | Kurokawa et al. |
| 2012/0001880 A1 | 1/2012 | Brown et al. |

FOREIGN PATENT DOCUMENTS

| | | | |
|---|---|---|---|
| EP | 2053450 A | 4/2009 | |
| EP | 2053846 A | 4/2009 | |
| EP | 2226708 A | 9/2010 | |
| EP | 2237104 A | 10/2010 | |
| EP | 2323021 A | 5/2011 | |
| EP | 2343738 A | 7/2011 | |
| EP | 2492781 A | 8/2012 | |
| EP | 2546878 A | 1/2013 | |
| JP | 62-183140 A | 8/1987 | |
| JP | 04-212454 A | 8/1992 | |
| JP | 04-257262 A | 9/1992 | |
| JP | 09-055482 A | 2/1997 | |
| JP | 2000-323672 A | 11/2000 | |
| JP | 2000-323699 A | 11/2000 | |
| JP | 2001-036087 A | 2/2001 | |
| JP | 2001-117115 A | 4/2001 | |
| JP | 2001-256782 A | 9/2001 | |
| JP | 2001-292276 A | 10/2001 | |
| JP | 2001-332714 A | 11/2001 | |
| JP | 2002-032037 A | 1/2002 | |
| JP | 2002-074962 A | 3/2002 | |
| JP | 2002-330351 A | 11/2002 | |
| JP | 2003-333427 A | 11/2003 | |
| JP | 2005-077822 A | 3/2005 | |
| JP | 2005-122450 A | 5/2005 | |
| JP | 2005-228956 A | 8/2005 | |
| JP | 2006-073735 A | 3/2006 | |
| JP | 2006-148513 A | 6/2006 | |
| JP | 2006-165529 A | 6/2006 | |
| JP | 2006-267982 A | 10/2006 | |
| JP | 2006-313639 A | 11/2006 | |
| JP | 2006-323199 A | 11/2006 | |
| JP | 2008-090141 A | 4/2008 | |
| JP | 2008-205870 A | 9/2008 | |
| JP | 2008-224935 A | 9/2008 | |
| JP | 2008-233257 A | 10/2008 | |
| JP | 2008-304900 A | 12/2008 | |
| JP | 2009-036946 A | 2/2009 | |
| JP | 2009-047964 A | 3/2009 | |
| JP | 2009-080469 A | 4/2009 | |
| JP | 2009-169394 A | 7/2009 | |
| JP | 2009-194260 A | 8/2009 | |
| JP | 2009-206438 A | 9/2009 | |
| JP | 2009-265512 A | 11/2009 | |
| JP | 2009-272452 A | 11/2009 | |
| JP | 2009-540628 | 11/2009 | |
| JP | 2009-283599 A | 12/2009 | |
| JP | 2010-054857 A | 3/2010 | |
| JP | 2010-153834 A | 7/2010 | |
| JP | 2010-228956 A | 10/2010 | |
| JP | 2010-273095 A | 12/2010 | |
| JP | 2011-129633 A | 6/2011 | |
| JP | 2013-219082 A | 10/2013 | |
| KR | 2008-0045543 A | 5/2008 | |
| WO | WO-2006/051993 | 5/2006 | |
| WO | WO-2007/145346 | 12/2007 | |
| WO | WO-2009/084629 | 7/2009 | |
| WO | WO-2009/096063 | 8/2009 | |
| WO | WO-2010/026830 | 3/2010 | |
| WO | WO-2010/092709 | 8/2010 | |
| WO | WO-2011/065558 | 6/2011 | |
| WO | WO-2011/145677 | 11/2011 | |

* cited by examiner

ELECTRONIC DEVICE

CROSS-REFERENCE TO RELATED APPLICATIONS

This application is a continuation of U.S. application Ser. No. 17/893,247, filed Aug. 23, 2022, now allowed, which is a continuation of U.S. application Ser. No. 17/223,248, filed Apr. 6, 2021, now U.S. Pat. No. 11,430,820, which is a continuation of U.S. application Ser. No. 16/902,124, filed Jun. 15, 2020, now U.S. Pat. No. 11,239,268, which is a continuation of U.S. application Ser. No. 16/161,209, filed Oct. 16, 2018, now U.S. Pat. No. 10,685,992, which is a continuation of U.S. application Ser. No. 14/990,934, filed Jan. 8, 2016, now U.S. Pat. No. 10,109,661, which is a divisional of U.S. application Ser. No. 13/224,655, filed Sep. 2, 2011, now U.S. Pat. No. 9,252,171, which claims the benefit of a foreign priority application filed in Japan as Serial No. 2010-198928 on Sep. 6, 2010, all of which are incorporated by reference.

BACKGROUND OF THE INVENTION

1. Field of the Invention

The present invention relates to an electronic device including a circuit using a photosensor and a transistor. For example, the present invention relates to an electronic device using, as its component, an electro-optical device typified by a liquid crystal display panel utilizing a touch panel.

2. Description of the Related Art

A CMOS sensor is used mostly in digital cameras or cellular phones and has an important imaging function. A CMOS sensor is a photosensor utilizing an amplifying function of a MOS transistor, and can be manufactured by a general CMOS process. In addition, a CMOS sensor requires lower driving voltage than a CCD sensor and thus leads to low power consumption of a solid-state imaging device.

A display device using a touch sensor is attracting attention. A display device using a touch sensor is called a touch panel, a touch screen, or the like (hereinafter also referred to simply as a touch panel). A touch panel is used mostly in personal computers or cellular phones and allows image display and operation to be done on the same panel. Patent Document 1 discloses a display device using an optical touch sensor.

A CMOS sensor performs three operations: storage of charge generated by a photodiode, read-out of the charge, and reset of the charge. In performing these three operations, a CMOS sensor uses a node that stores charge resulting from photocurrent generated by a photodiode (such a node is hereinafter referred to as an FD), and wire for supplying a control signal. Patent Document 2 discloses a structure of a solid-state imaging device with a layout that allows the potential of such an FD storing charge to be insusceptible to fluctuations in the potential of a signal line.

REFERENCE

Patent Documents

[Patent Document 1] Japanese Published Patent Application No. 2001-292276
[Patent Document 2] Japanese Published Patent Application No. 2006-148513

SUMMARY OF THE INVENTION

In case of presence of parasitic capacitance during these three operations which occurs between an FD that stores charge resulting from photocurrent generated by a photodiode and either wire that supplies a control signal or another signal line, changes in the signal causes changes in the potential of the FD. As a result, the output of the photosensor changes, so that imaging quality decreases.

In a display device using a CMOS sensor, each pixel includes an FD. Therefore, as in the case of wire in an imaging element, in case of present of parasitic capacitance between a signal line in a display element and an FD, changes in the signal causes changes in the potential of the FD. As a result, the output of the photosensor changes, so that imaging quality decreases.

An object of one embodiment of the present invention is to provide a pixel structure that prevents a decrease in imaging quality caused by changes in the output of the photosensor.

One embodiment of the present invention provides a pixel layout structure in which a shielding wire is disposed between an FD and an imaging signal line (a PR line, a TX line, or an SE line) or between the FD and an image-display signal line in order to reduce or eliminate parasitic capacitance between the FD and a signal line for the purpose of suppressing changes in the potential of the FD. An imaging power supply line, an image-display power supply line, a GND line, a common line, or the like whose potential is fixed, such as a common potential line, is used as a shielding wire.

One embodiment of the present invention disclosed in this specification suppresses changes in the potential of an FD (node) by using two capacity lines for the adjacent pixels as a first shielding wire and a second shielding wire and disposing these lines between the FD and a display signal line. Specifically, this is an electronic device including a pixel structure including: a first transistor electrically connected to a first pixel electrode and a first signal line; a second transistor electrically connected to a photodiode; and a third transistor electrically connected to a second pixel electrode and a second signal line. The second transistor is electrically connected to a node storing charge. A first shielding wire is provided between the node and the first signal line electrically connected to the first transistor. A second shielding wire is provided between the node and the second signal line electrically connected to the third transistor. Note that the phrase "a shielding wire is provided between the node and a signal line electrically connected to the first transistor" indicates a pixel layout in which a shielding wire is provided between the node and a signal line when seen from above.

The above-stated structure resolves at least one of the above-mentioned problems.

Another embodiment of the present invention suppresses changes in the potential of an FD (node) by using a capacity line for a pixel as a shielding wire, disposing this line between the FD and a display signal line, and disposing the same shielding wire between the FD and a TX line. Specifically, this is an electronic device including: a first transistor electrically connected to a pixel electrode and a first signal line; and a second transistor electrically connected to a photodiode. The second transistor is electrically connected to a node storing charge. A shielding wire is provided between the node and the first signal line electrically connected to the first transistor. The shielding wire is provided between the node and a second signal line electrically connected to a gate of the second transistor.

The above-stated structure resolves at least one of the above-mentioned problems.

Another embodiment of the present invention suppresses changes in the potential of an FD (node) by using a capacity line for a pixel as a shielding wire, disposing this line between the FD and a display signal line, and disposing the same shielding wire between the FD and a PR line. Specifically, this is an electronic device including: a first transistor electrically connected to a pixel electrode and a first signal line; and a second transistor electrically connected to a photodiode. The second transistor is electrically connected to a node storing charge. A shielding wire is provided between the node and the first signal line electrically connected to the first transistor. The shielding wire is provided between the node and a second signal line electrically connected to the photodiode.

The above-stated structure resolves at least one of the above-mentioned problems.

Another embodiment of the present invention suppresses changes in the potential of an FD (node) by using a capacity line for a pixel as a shielding wire, disposing this line between the FD and a display signal line, and disposing the same shielding wire between the FD and an SE line. Specifically, this is an electronic device including: a first transistor electrically connected to a pixel electrode and a first signal line; a second transistor electrically connected to a photodiode; a third transistor a gate of which is a node storing charge; and a fourth transistor electrically connected to the third transistor. The second transistor is electrically connected to the node. A shielding wire is provided between the node and the first signal line electrically connected to the first transistor. The shielding wire is provided between the node and a second signal line electrically connected to a gate of the fourth transistor.

The above-stated structure resolves at least one of the above-mentioned problems.

Reducing parasitic capacitance between a node and a signal line which may adversely affect the potential of the node can suppress fluctuations in the output of a photosensor, thereby preventing imaging quality from decreasing.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed. Moreover, the present invention should not be construed as being limited to the description of the embodiments below.

Embodiment 1

Figure 1A:
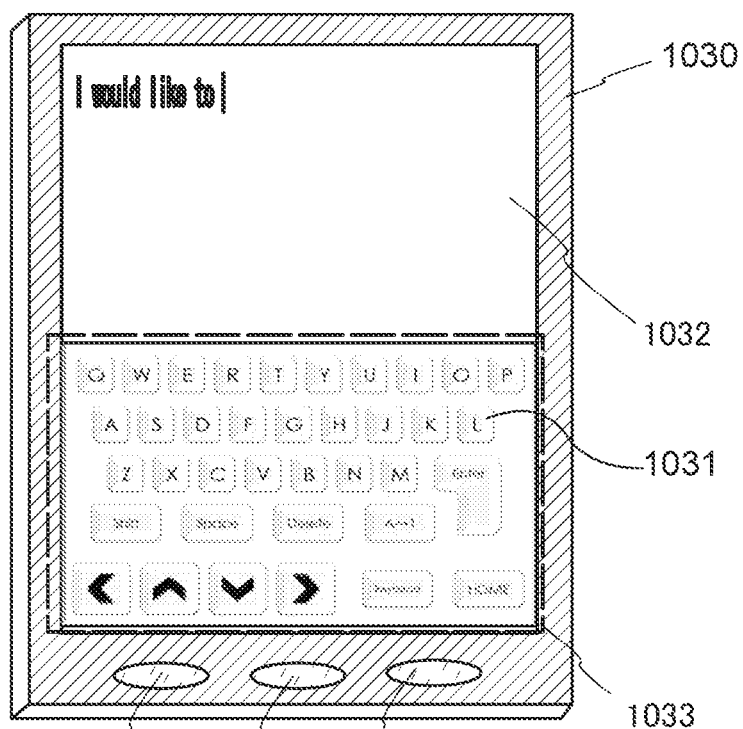
FIGS. 1A and 1B are external views illustrating one embodiment of the present invention.

In this embodiment, an example of an electronic device 1030 including a display area 1032 in which an image is displayed using external light will be described with reference to FIGS. 1A and 1B.

The display area 1032 in the electronic device 1030 has a touch-input function for which photo sensors are used. A plurality of keyboard buttons 1031 is displayed on a display area region 1033 as illustrated in FIG. 1A. The display area 1032 indicates the entire display region and includes the display area region 1033. A user inputs information by touching desired keyboard buttons, so that the input information is displayed on the display area 1032.

An example of the usage of the electronic device 1030 will be described. For example, characters are input by either the user's fingers successively touching keyboard buttons displayed on the display area region 1033 or noncontact, and the resulting text is displayed on a region other than the display area region 1033. After a set period of time during which no output signal of the photosensor is detected has passed from when the user removes his finger from the keyboard on the screen, the keyboard displayed on the display area region 1033 is erased automatically and the input text is displayed also on the display area region 1033, so that the user can see the input text with the whole screen. In the case where input is performed again, the keyboard buttons can be displayed on the display area region 1033 again and character input can also be performed by forcing the device to detect an output signal of a photosensor by either the user's fingers successively touching the display area 1032 or noncontact.

Figure 1B:
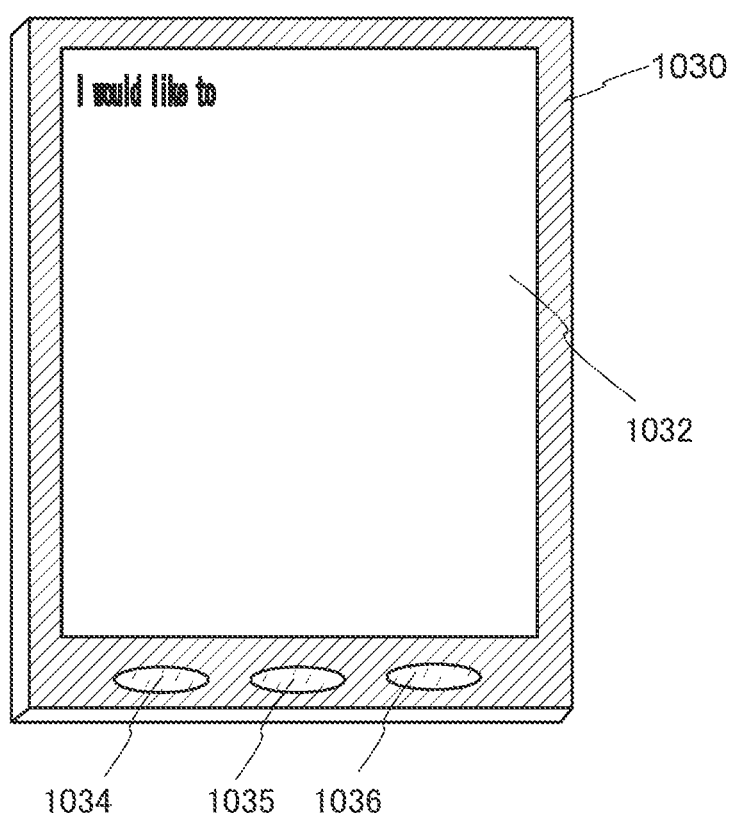

Alternatively, an image without the keyboard can be displayed on the display area 1032 not automatically but by the user pushing a switch 1034, as illustrated in FIG. 1B. The keyboard can be displayed and also made ready for touch input by pushing a keyboard display switch 1036.

In addition, the switch 1034, a power supply switch 1035, and the keyboard display switch 1036 may be displayed on the display area 1032 as switch buttons. Each operation may be performed by a touch on the displayed switch button.

The electronic device 1030 includes at least a battery, and preferably includes a memory for storing data (e.g., a flash memory circuit, an SRAM circuit, or a DRAM circuit), a central processing unit (CPU), or a logic circuit. With a CPU or a memory, the device can install various kinds of software and thus can realize part or all of the functions of a personal computer.

In addition, when a gradient detector such as a gyroscope or a triaxial acceleration sensor is provided in the electronic device 1030, a function used in the electronic device 1030, particularly a function relating to display and input performed on the display area can be switched by an arithmetic circuit in response to a signal from the gradient detector. Therefore, unlike an electronic device with an input key whose type, size, or location is predetermined, such as a built-in operation key, the electronic device 1030 can improve the user's convenience.

Figure 2:
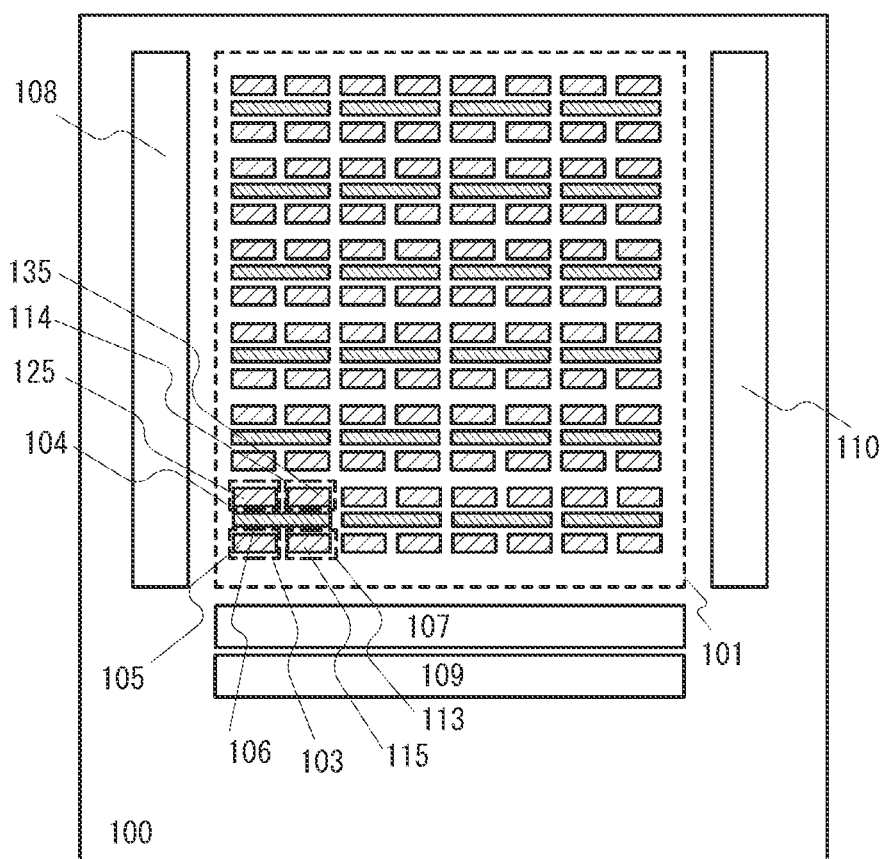
FIG. 2 is a block diagram illustrating one embodiment of the present invention.

Next, an example of a display panel included in the display area 1032 will be described with reference to FIG. 2. A display panel 100 includes a pixel circuit 101, a display element control circuit, and a photosensor control circuit. The pixel circuit 101 includes a plurality of pixels 103, 104, 113, and 114 and a plurality of photosensors 106 which are arranged in a matrix of rows and columns. Each of the pixels 103, 104, 113, and 114 includes one display element. In this embodiment, one photosensor 106 is placed between the pixel 103 and the pixel 104 and between the pixel 113 and the pixel 114. In other words, this embodiment employs a pixel layout structure in which one photosensor is used for four pixels.

The pixels 103, 104, 113, and 114 each include a liquid crystal element including a transistor, a storage capacitor, and a liquid crystal layer. The transistors are electrically connected to pixel electrodes 105, 115, 125, and 135. The transistor has a function of controlling injection or ejection of charge to/from the storage capacitor. The storage capacitor has a function of retaining charge corresponding to a voltage applied to the liquid crystal layer. Taking advantage of changes in polarization direction due to a voltage application to the liquid crystal layer, contrast of light passing through the liquid crystal layer (gray scale) is made, so that image display is realized. External light (sunlight or illumination light) which enters from the outside of a liquid crystal display device is used as the light passing through the liquid crystal layer. There is no particular limitation on the liquid crystal layer, and a known liquid crystal material (typically, a nematic liquid crystal material or a cholesteric liquid crystal material) may be used. For example, polymer dispersed liquid crystal (PDLC) or polymer network liquid crystal (PNLC) may be used for the liquid crystal layer so that a white image (a bright image) is displayed using scattered light by liquid crystal.

Further, the display element control circuit is a circuit configured to control the pixels 103, 104, 113, and 114 and includes a display element driver circuit 107 which inputs a signal to the pixel electrodes 105, 115, 125, and 135 through the transistor via a signal line (also referred to as a source signal line) such as a video data signal line, and a display element driver circuit 108 which inputs a signal to the gate electrode of the transistor placed in each pixel via a scan line (also referred to as a gate signal line).

For example, the display element driver circuit 108 connected to the scan lines has a function of selecting the display elements included in the pixels placed in a particular row. The display element driver circuit 107 connected to the signal lines has a function of applying a predetermined potential to the display elements included in the pixels placed in the selected row. Note that in the display element to which the display element driver circuit 108 connected to the scan lines applies high potential, the transistor is in a conduction state, so that the display element is supplied with charge from the display element driver circuit 107 connected to the scan lines.

The photosensor 106 includes a transistor and a light-receiving element which has a function of generating an electrical signal when receiving light, such as a photodiode.

The photosensor control circuit is a circuit configured to control the photosensors 106 and includes a photosensor reading circuit 109 connected to signal lines such as photosensor output signal lines and photosensor reference signal lines, and a photosensor driver circuit 110 connected to the scan lines. The photosensor driver circuit 110 connected to the scan lines has a function of performing reset operation and selecting operation, which will be described later, on the photosensors 106 included in the pixels placed in a particular row. Further, the photosensor reading circuit 109 connected to the signal lines has a function of taking out output signals of the photosensors 106 included in the pixels in the selected row.

A circuit diagram of the pixel 103 and the photosensor 106 will be described in this embodiment with reference to FIG. 3.

A pixel 301 includes a transistor 330, a storage capacitor 331, and a liquid crystal element 332. A photosensor 302 includes a photodiode 351, a transistor 352, a transistor 353, and a transistor 354.

A gate of the transistor 330 is electrically connected to a gate signal line 310, one of a source and a drain of the transistor 330 is electrically connected to a video data signal line 311, and the other of the source and the drain of the transistor 330 is electrically connected to one electrode of the storage capacitor 331 and one of the electrodes of the liquid crystal element 332. The other electrode of the storage capacitor 331 is electrically connected to a capacitor line 312 and held at a fixed potential. The other electrode of the liquid crystal element 332 is held at a fixed potential. The liquid crystal element 332 is an element including a pair of electrodes and a liquid crystal layer provided between the pair of electrodes.

When "H" (high-level potential) is applied to the gate signal line 310, the transistor 330 applies the potential of the video data signal line 311 to the storage capacitor 331 and the liquid crystal element 332. The storage capacitor 331 holds the applied potential. The light transmittance of the liquid crystal element 332 is changed in accordance with the applied potential.

One electrode of the photodiode 351 is electrically connected to a photodiode reset signal line 341 (also referred to as a PR line), and the other electrode is electrically connected to one of a source and a drain of the transistor 352. The other of the source and the drain of the transistor 352 is an FD (node).

The transistor 352 has a function of controlling and holding the voltage of the FD (node). The gate of the transistor 352 is connected to a photosensor charge transmit signal line 342 (also referred to as a TX line). The signal line 342 has a function of controlling the switching of the transistor 352.

A gate of the transistor 354 is the FD (node). One of a source and a drain of the transistor 354 is electrically connected to a power source line 344. Further, one of the source and the drain of the transistor 354 is electrically connected to one of a source and a drain of the transistor 353.

A gate of the transistor 353 is electrically connected to a photosensor reference signal line 345 (an SE line). The other of the source and the drain of the transistor 353 is electrically connected to a photosensor output signal line 343 (also referred to as an OUT line).

Next, an example of a structure of the photosensor reading circuit 109 will be described with reference to FIG. 4. As an example, the display area includes pixels provided in 1024 rows and 768 columns. One display element is provided in each pixel in the rows and columns and one photosensor is provided to pixels in two rows and two columns. In other words, the display elements are provided in 1024 rows and 768 columns, and the photosensors are provided in 512 rows and 384 columns. In addition, this embodiment shows the case where a signal is output to the outside of the display device under the condition that photosensor output signal lines in two columns are regarded as one pair. In other words, one output is obtained from two photosensors provided between four pixels in two rows and two columns.

Figure 3:
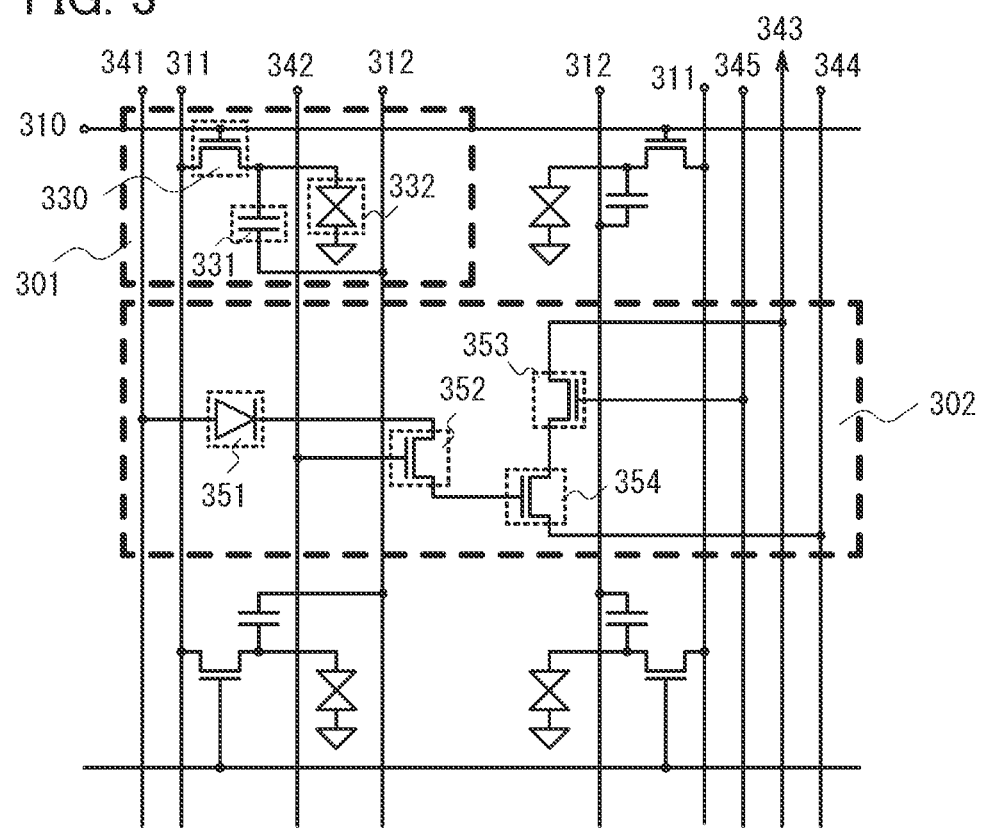
FIG. 3 is an equivalent circuit diagram of a pixel, illustrating one embodiment of the present invention.

FIG. 3 illustrates a circuit configuration of pixels showing four pixels and one photosensor provided in two rows and two columns. One display element is provided for each pixel and one photosensor is provided for four pixels. FIG. 4 illustrates a circuit configuration of the photosensor reading circuit 109, in which some photosensors are illustrated for explanation. Transistors each having a channel formation region including an oxide semiconductor can be used as transistors shown in FIG. 3.

Figure 4:
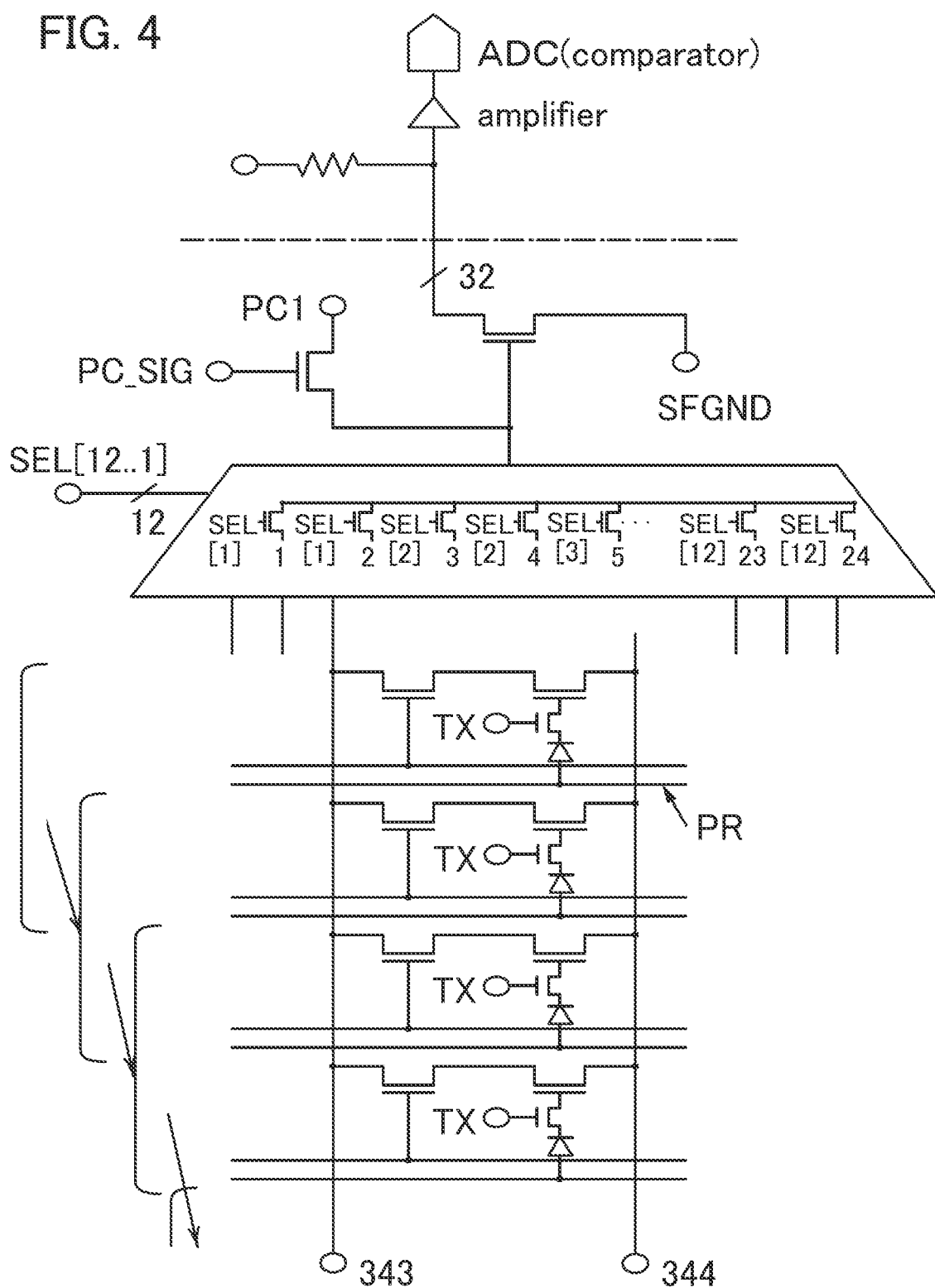
FIG. 4 is a schematic view of a driver circuit for photosensors, illustrating one embodiment of the present invention.

As an example, the case where a driving method in which, as illustrated in FIG. 4, a scan line driver circuit for photosensors drives pixels for four rows (that is, photosensors for two rows) simultaneously and shifts selected rows by one row including photosensors corresponding to pixels for two rows will be given. Here, photosensors in each row are continually selected in a period in which the scan line driver circuit shifts selected rows twice. Such a driving method facilitates improvement in frame frequency at the time of imaging by a photosensor. In particular, it is advantageous in the case of a large-sized display device. Note that outputs of photosensors in two rows are superimposed on the photosensor output signal line 343 at one time. All of the photosensors can be driven by repeating shift of selected rows 512 times.

As illustrated in FIG. 4, in the photosensor reading circuit 109, one selector is provided per pixels for 24 rows. The selector selects 1 pair from 12 pairs of photosensor output signal lines 343 (1 pair corresponds to photosensor output signal lines 211 for two columns) in the display area and obtains an output. In other words, the photosensor reading circuit 109 includes 32 selectors in total and obtains 32 outputs at one time. Selection is performed on all of the 12 pairs in each selector, whereby 384 outputs which correspond to one row of photosensors can be obtained in total. The selector selects 1 pair from the 12 pairs every time selected rows are shifted by the scan line driver circuit of photosensors, whereby outputs from all of the photosensors can be obtained.

In this embodiment, the structure in which, as illustrated in FIG. 4, the photosensor reading circuit 109 connected to the signal lines takes out outputs of photosensors, which are analog signals, to the outside of the display device and the outputs are amplified with the use of an amplifier provided outside the display device and converted to digital signals with the use of an AD converter will be given. Needless to say, the following structure may also be employed: the AD converter is mounted on a substrate over which the display device is provided, and the outputs of photosensors are converted to digital signals and then the digital signals are taken out to the outside of the display device.

A method for driving the photosensor circuit shown in FIG. 3 will be described with a timing diagram of FIG. 6.

Figure 6:
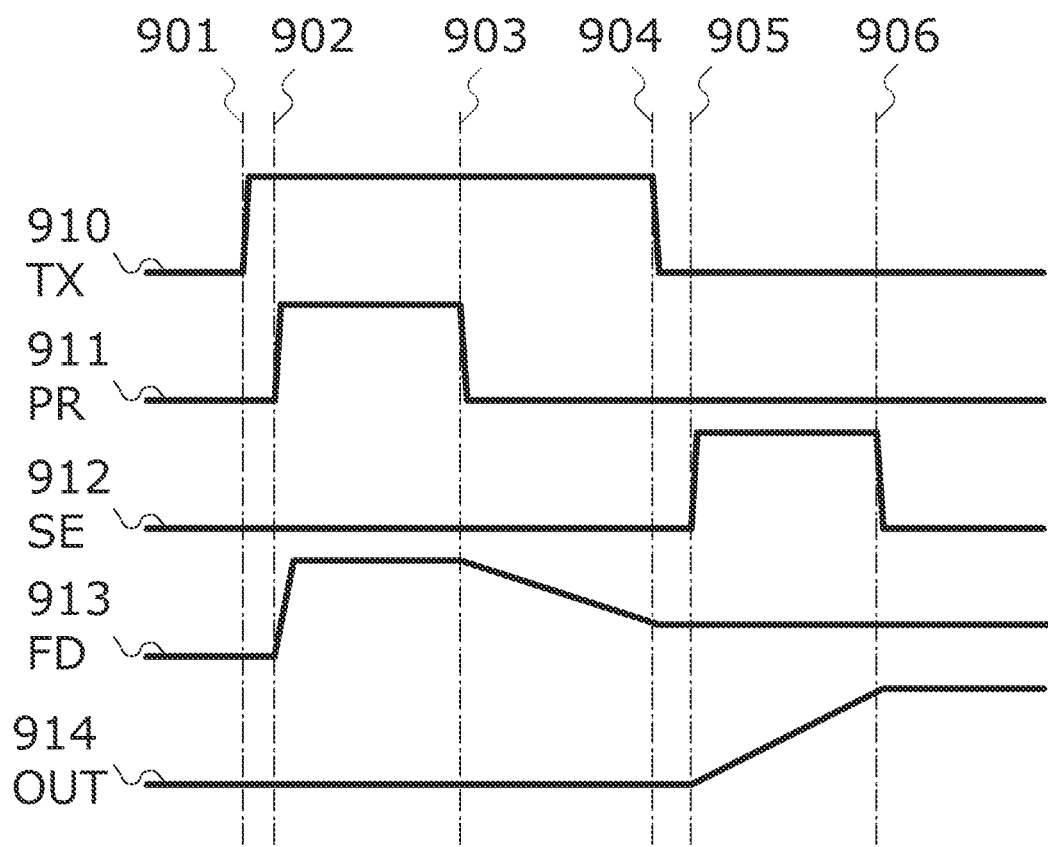
FIG. 6 is a timing diagram illustrating one embodiment of the present invention.

In the case shown in FIG. 6, a binary signal is applied to a TX910, a PR911, and an SE912 for convenience. Hereinafter, a high potential of the TX910 is referred to as "High-TX"; a low potential of the TX910, "Low-TX"; a high potential of the PR911, "High-PR"; a low potential of the PR911, "Low-PR"; a high potential of the SE912, "High-SE"; and a low potential of the SE912, "Low-SE". Note that each potential is actually an analog signal, so that each potential does not necessarily have two values and may have any number of values depending on conditions.

First, at a time 901, the TX910 is brought "High-TX". Next, at a time 902, the PR911 is brought "High-PR". Then, an FD potential 913 becomes "High-PR" which is the same as the potential of the PR911. This is called a reset operation.

When the PR911 is brought "Low-PR" at a time 903, the FD potential 913 remains "High-PR", which makes a PIN photodiode reverse-biased (the start of a storage operation). At the same time, light enters an i-type layer in the PIN photodiode and a flow of reverse current is produced, so that the amount of charge stored on the FD changes according to the amount of light.

When the TX910 is brought "Low-TX" at a time 904, movement of charge from the FD to the PIN photodiode stops, and the amount of charge stored on the FD is determined (the end of the storage operation).

When the SE912 is brought "High-SE" at a time 905, charge is supplied from the power source line to the OUT line in accordance with the FD potential 913 (the start of a reading operation).

When the SE912 is brought "Low-SE" at a time 906, supply of charge from the power source line to the OUT line is stopped, so that the OUT914 is determined (the end of the reading operation). The use of the OUT914 can reproduce a captured image.

After that, the operation at the time 901 is performed and the same operations as those described above are repeated.

In this embodiment, when the reset operation, the storage operation, and the reading operation are performed on the photosensors, a partial shadow of external light can be detected. In addition, when image processing or the like is performed on the detected shadow appropriately, a position where a finger, a pen, or the like touches the display device can be recognized. Operation corresponding to the position where the display device is touched, for example, as for input of characters, kinds of characters are regulated in advance, so that desired characters can be input.

Note that in the display device in this embodiment, the partial shadow of external light is detected by the photosensors. Therefore, even if a finger, a pen, or the like does not touch the display device physically, when the finger, the pen, or the like gets close to the display device without contact and a shadow is formed, detection of the shadow is possible. Hereinafter, "a finger, a pen, or the like touches the display device" includes the case where the finger, the pen, or the like is close to the display device without contact.

With the above structure, the display area 1032 can have a touch-input function.

Embodiment 2

Figure 5:
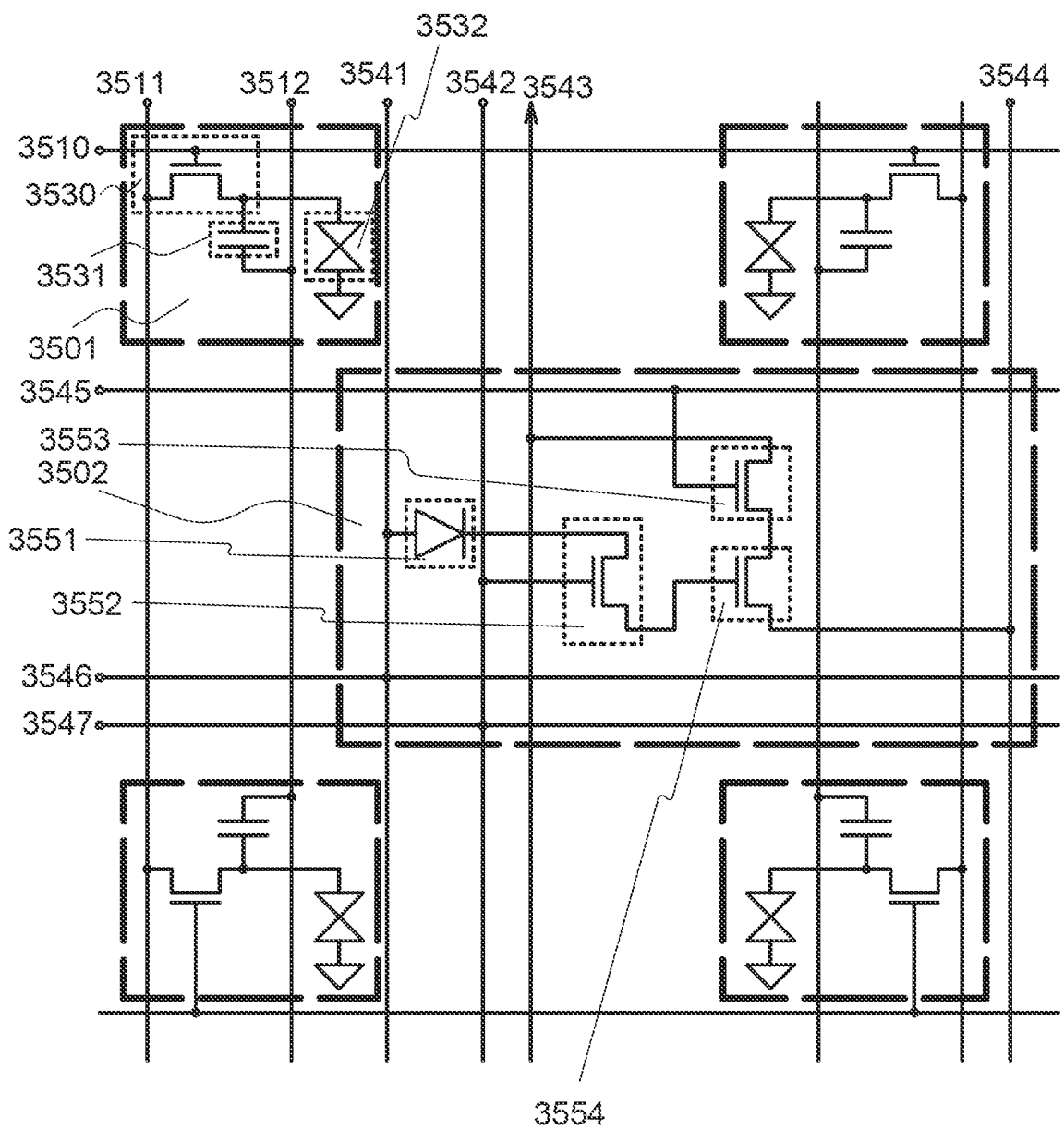
FIG. 5 is an equivalent circuit diagram of a pixel, illustrating one embodiment of the present invention.
Figure 7:
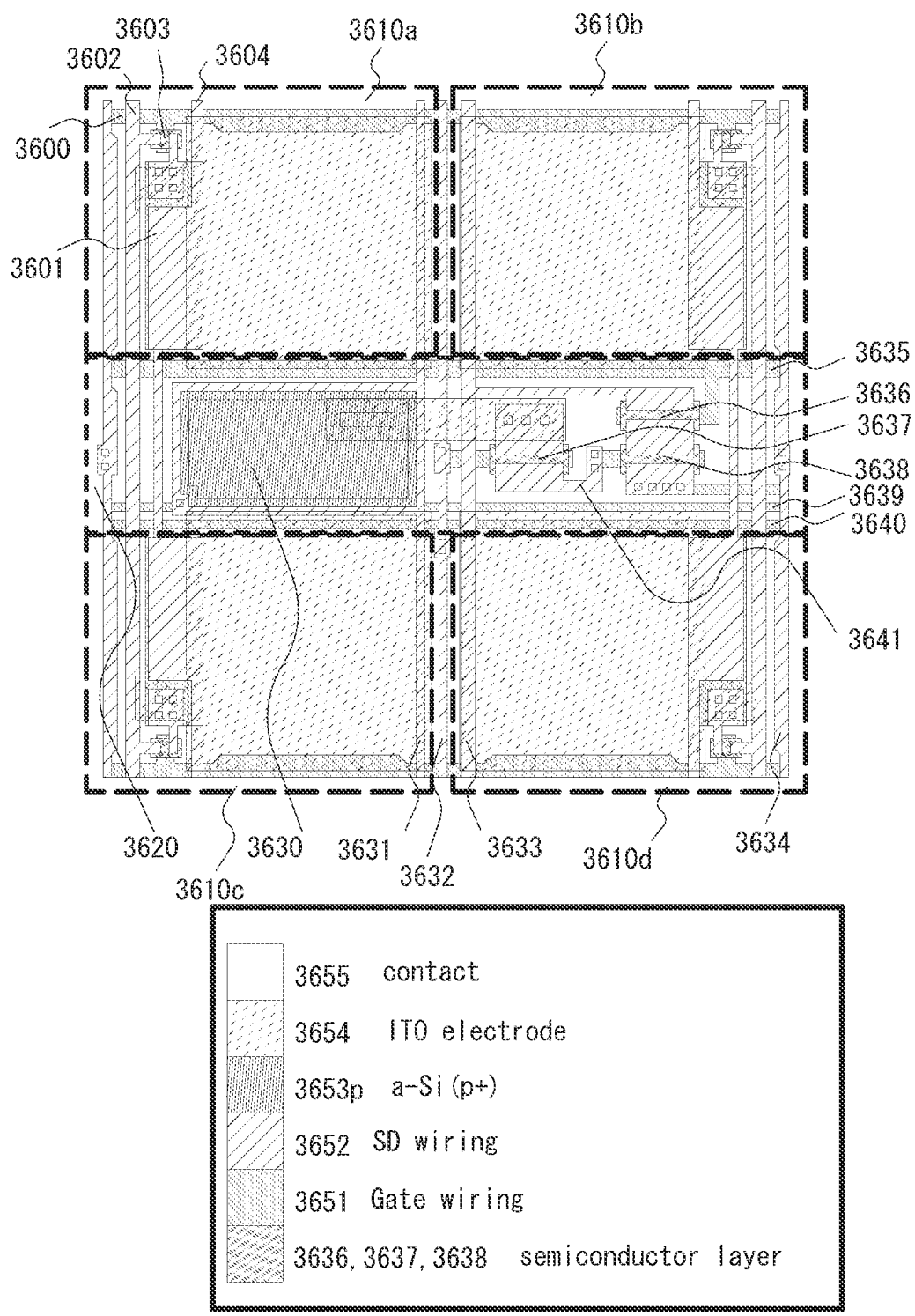
FIG. 7 is a layout pattern illustrating a pixel, illustrating one embodiment of the present invention.

In this embodiment, the configuration of a circuit which is partly different from the circuit shown in FIG. 3 is shown in FIG. 5, and an example of a pixel layout is shown in FIG. 7.

The pixel circuit includes a display circuit 3501 and a sensor circuit 3502.

The display circuit includes a transistor 3530, a liquid crystal element 3532, and a capacitor 3531. A gate of the transistor 3530 is connected to a signal line 3510. One of a source and a drain of the transistor 3530 is connected to a signal line 3511, and the other is connected to one electrode of the capacitor 3531 and one electrode of the liquid crystal element 3532. The other electrode of the capacitor 3531 is connected to a signal line 3512. The other electrode of the liquid crystal element 3532 corresponds to a common electrode.

The sensor circuit includes a PIN photodiode 3551, a FET-T 3552, a FET-AMP 3554, and a FET-S 3553. A gate of the FET-T 3552 is connected to TX lines 3542 and 3547. One of a source and a drain of the FET-T 3552 is connected to a cathode of the PIN photodiode 3551, and the other is connected to a gate of the FET-AMP 3554.

A source of the FET-AMP 3554 is connected to a power source line 3544, and a drain of the FET-AMP 3554 is connected to a source of the FET-S 3553. A gate of the FET-S 3553 is connected to a SE line 3545, and a source of the FET-S 3553 is connected to an OUT line 3543. An anode of the PIN photodiode 3551 is connected to PR lines 3541 and 3546. Transistors each having a channel formation region including an oxide semiconductor can be used as transistors shown in FIG. 5.

FIG. 7 illustrates an example of a plan view of a pixel layout corresponding to the circuit diagram of FIG. 5.

The pixel layout includes layouts of four display circuits 3610a, 3610b, 3610c, and 3610d, and a layout of a sensor circuit 3620. The layouts of the display circuits 3610a, 3610b, 3610c, and 3610d each include a selection FET 3603, a Cs line 3601, a video data line 3602, a selection line 3600, and a COM line 3604.

The layout of the sensor circuit 3620 includes a PIN photodiode 3630, a FET-T including a semiconductor layer 3637, a FET-AMP including a semiconductor layer 3638, a FET-T including a semiconductor layer 3636, an FD 3641, a vertical TX line 3632, a horizontal TX line 3640, a vertical PR line 3631, a horizontal PR line 3639, an SE line 3635, an OUT line 3633, and a VDD line 3634. There is no particular limitation on a material for the semiconductor layers 3636, 3637, and 3638. For example, a polycrystalline semiconductor film (e.g., a polysilicon film), a microcrystalline semiconductor film, or an oxide semiconductor film represented by the chemical formula $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. In addition, the above oxide semiconductor film may contain $SiO_2$.

The pixel layout includes the following layers: semiconductor layers 3636, 3637, and 3638, a gate line layer 3651, an SD line layer 3652, a Si layer 3653, and an ITO electrode layer 3654. The vertical TX line 3632 and the vertical PR line 3631 are formed utilizing the SD line layer 3652. The horizontal TX line 3640 and the horizontal PR line 3639 are formed utilizing the gate line layer 3651. Horizontal lines and vertical lines have contacts with each other, thereby forming a mesh layout.

In the pixel layout, the Cs line 3601 serving as a shielding wire is present between the FD 3641 and either the video data line 3602 or a signal line for the adjacent pixel. Therefore, parasitic capacitance between the FD 3641 and the plurality of signal lines is reduced, or changes in the potentials of neighbor elements due to the changes in the voltages of the signal lines are prevented, thereby avoiding changes in the potential of the FD.

A feature of the pixel layout is the fact that the FD 3641 has a sufficient distance from the PR line, the SE line, and the OUT line for the pixel in which the FD 3641 is provided and for the adjacent pixel. Thus, changes in the potential of the FD 3641 can be suppressed and a display device with an imaging function that causes less noise in an output signal of a photosensor can be provided.

Figure 8A:
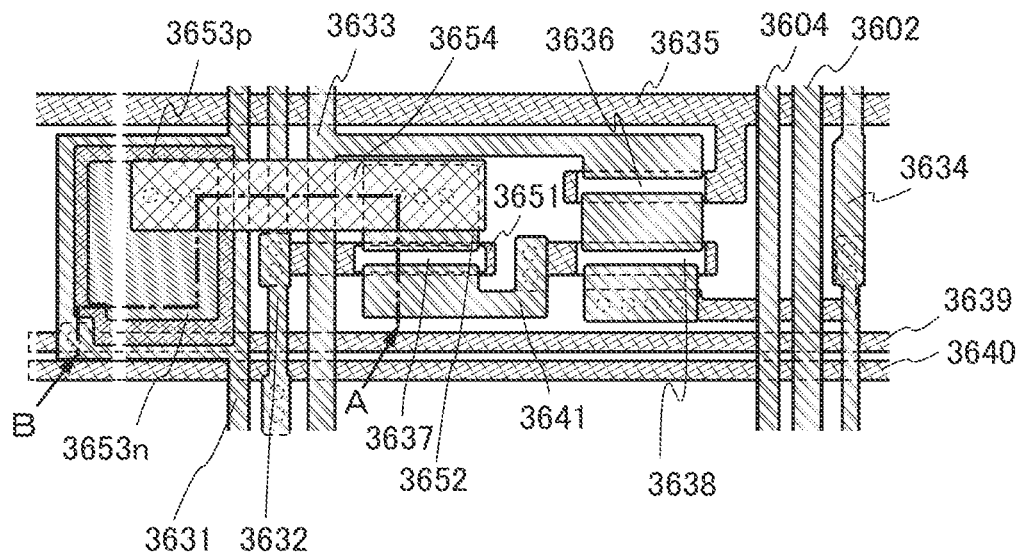
FIGS. 8A and 8B are a plan view and a cross-sectional view of a transistor connected to a photosensor and its periphery, illustrating one embodiment of the present invention.
Figure 8B:
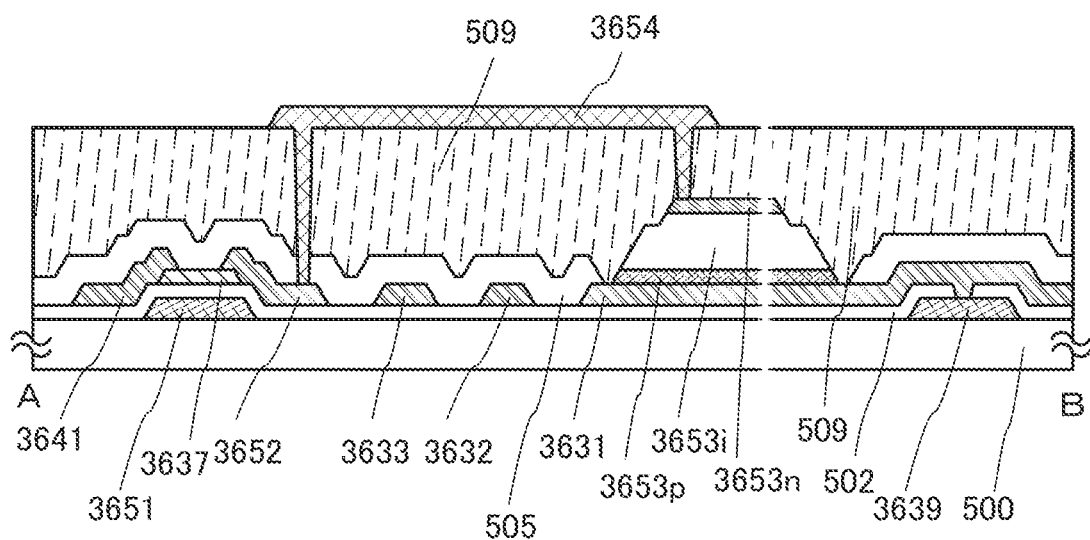

FIG. 8A is an enlarged view of a part of FIG. 7, and FIG. 8B is an example of a cross-sectional structure thereof.

Note that portions shown in FIG. 8A and FIG. 8B that are common to those in FIG. 7 use the same reference numerals as those in FIG. 7.

In FIG. 8B, the gate line layer 3651 included in the transistor electrically connected to the photodiode, and the horizontal PR line 3639 which are formed using the same material and in the same process are formed over a substrate 500. Further, a gate insulating layer 502 covering the gate line layer 3651 and the horizontal PR line 3639 is formed, and the semiconductor layer 3637 is formed over the gate insulating layer 502 so as to overlap with the gate line layer 3651.

Moreover, the SD line 3652 that partly overlaps with the semiconductor layer 3637 is formed, and the first interlayer insulating layer 505 covering the SD line 3652 is formed. The PIN photodiode 3630 is a photoelectric conversion layer which is a stack of a silicon layer 3653p containing a p-type impurity element, an i-type amorphous silicon layer 3653i, and a silicon layer 3653n containing an n-type impurity element.

Further, a second interlayer insulating layer 509 covering the PIN photodiode 3630 and the first interlayer insulating layer 505 is formed, and the ITO electrode 3654 using a transparent conductive film is formed over the second interlayer insulating layer 509. The ITO electrode 3654 serves as a contact electrode for connecting the SD line 3652 for the transistor including the semiconductor layer 3637 to the PIN photodiode 3630. Note that the pixel electrode which is formed using the same material and in the same process as the ITO electrode 3654 is formed in the display region.

The case where the transistor electrically connected to the PIN photodiode 3630 is a bottom-gate transistor has been shown in FIG. 8B; however, there is no particular limitation on the structure of the transistor. The transistor may have another bottom-gate structure or a top-gate structure instead.

Embodiment 3

In this embodiment, an example of an electronic device including a display area (a touch panel) having the touch-input function that has been described in the above embodiments will be described.

Figure 9A:
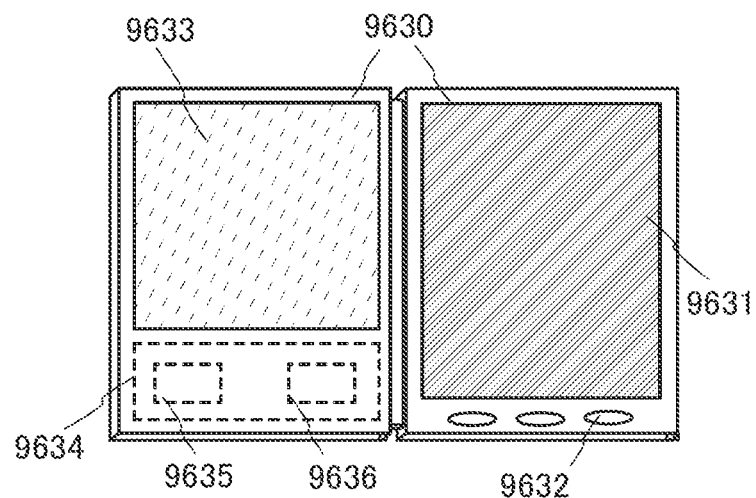
FIGS. 9A and 9B are a diagram and a block diagram of an electronic device, illustrating one embodiment of the present invention.

FIG. 9A illustrates an information terminal that can include housings 9630, a display area 9631, operation keys 9632, a solar battery 9633, and a charge and discharge control circuit 9634. The information terminal is provided with the solar battery 9633 and a touch panel so that the solar battery 9633 and the touch panel can be opened and closed freely. Note that in FIG. 9A, a structure of the information terminal including a battery 9635 and a DCDC converter (hereinafter abbreviated as a converter 9636) is illustrated as an example of the charge and discharge control circuit 9634.

Note that a structure in which the solar battery 9633 is provided on each of a surface and a rear surface of the housing 9630 is preferable in order to charge the battery 9635 efficiently. The use of a lithium ion battery as the battery 9635 produces an advantage such as downsizing.

The structure and the operation of the charge and discharge control circuit 9634 illustrated in FIG. 9A are described with reference to a block diagram in FIG. 9B. The solar battery 9633, the battery 9635, the converter 9636, a converter 9637, switches SW1 to SW3, and the display area 9631 are illustrated in FIG. 9B, and the battery 9635, the converter 9636, the converter 9637, and the switches SW1 to SW3 correspond to the charge and discharge control circuit 9634.

First, an example of the operation in the case where power is generated by the solar battery 9633 using external light will be described. The voltage of power generated by the solar battery is raised or lowered by the converter 9636 so that the power has a voltage for charging the battery 9635. Then, when the power from the solar battery 9633 is used for the operation of the display area 9631, the switch SW1 is turned on and the voltage of the power is raised or lowered by the converter 9637 so as to be a voltage needed for the display area 9631. In addition, when an image is not displayed on the display area 9631, the switch SW1 is turned off and the switch SW2 is turned on so that charge of the battery 9635 may be performed.

Note that although the solar battery 9633 is described as an example of a charging method, the battery 9635 may be charged with another method. In addition, a combination of the solar battery 9633 and another charging method may be used.

Figure 9B:
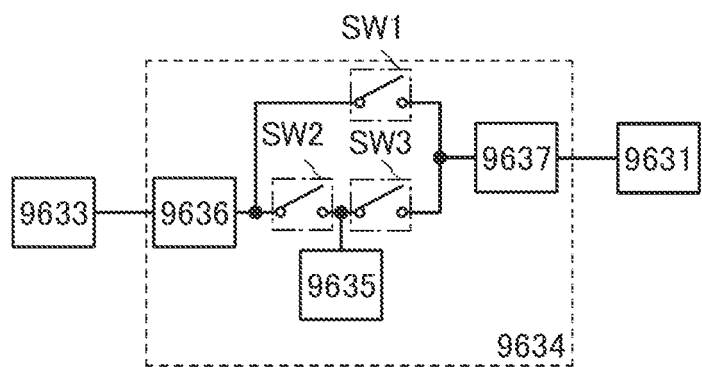

Needless to say, one embodiment of the present invention is not necessarily the electronic device shown in FIGS. 9A and 9B as long as it includes a display area (a touch panel) having the touch-input function that has been described in the above embodiments.

This embodiment can be implemented in appropriate combination with any structure described in the other embodiments.

This application is based on Japanese Patent Application serial No. 2010-198928 filed with Japan Patent Office on Sep. 6, 2010, the entire contents of which is hereby incorporated by reference.

What is claimed is:

1. An electronic device comprising a pixel, the pixel comprising:
   a photodiode;
   a first wire electrically connected to an anode of the photodiode;
   a second wire electrically connected to the first wire;
   a first transistor;
   a second transistor; and
   a third transistor,
   wherein a gate of the first transistor is electrically connected to a third wire,
   wherein one of a source and a drain of the first transistor is electrically connected to a cathode of the photodiode,
   wherein the other of the source and the drain of the first transistor is electrically connected to a fourth wire,
   wherein a gate of the second transistor is electrically connected to the fourth wire,
   wherein one of a source and a drain of the second transistor is electrically connected to a fifth wire,
   wherein a gate of the third transistor is electrically connected to a sixth wire,
   wherein one of a source and a drain of the third transistor is electrically connected to the other of the source and the drain of the second transistor,
   wherein the other of the source and the drain of the third transistor is electrically connected to a seventh wire, and
   wherein the first wire and the second wire are positioned in different layers.

2. The electronic device according to claim 1, wherein the first wire, the fourth wire, and the fifth wire are positioned in the same layer.

3. The electronic device according to claim 1, wherein, in a plan view, the fourth wire is positioned between the first wire and the fifth wire.

4. The electronic device according to claim 1, wherein, in a plan view, the first wire and the second wire cross each other.

5. The electronic device according to claim 1, wherein, in a plan view, the fifth wire and the second wire cross each other,
   wherein, in the plan view, the fifth wire and the third wire cross each other, and
   wherein, in the plan view, the fifth wire and the sixth wire cross each other.

6. The electronic device according to claim 1, wherein the second wire, the third wire, and the sixth wire are poisoned in the same layer.

7. An electronic device comprising a pixel, the pixel comprising:
   a photodiode;
   a first wire electrically connected to an anode of the photodiode;
   a second wire electrically connected to the first wire;
   a first transistor;
   a second transistor; and
   a third transistor,
   wherein a gate of the first transistor is electrically connected to a third wire,
   wherein one of a source and a drain of the first transistor is electrically connected to a cathode of the photodiode,
   wherein the other of the source and the drain of the first transistor is electrically connected to a fourth wire,
   wherein a gate of the second transistor is electrically connected to the fourth wire,
   wherein one of a source and a drain of the second transistor is electrically connected to a fifth wire,
   wherein a gate of the third transistor is electrically connected to a sixth wire,
   wherein one of a source and a drain of the third transistor is electrically connected to the other of the source and the drain of the second transistor,
   wherein the other of the source and the drain of the third transistor is electrically connected to a seventh wire,
   wherein the first wire and the second wire are positioned in different layers,
   wherein the first wire, the fourth wire, and the fifth wire are positioned in the same layer, and
   wherein the second wire, the third wire, and the sixth wire are positioned in the same layer.

8. The electronic device according to claim 7, wherein, in a plan view, the fourth wire is positioned between the first wire and the fifth wire.

9. The electronic device according to claim 7, wherein, in a plan view, the first wire and the second wire cross each other.

10. The electronic device according to claim 7, wherein, in a plan view, the fifth wire and the second wire cross each other,
    wherein, in the plan view, the fifth wire and the third wire cross each other, and wherein, in the plan view, the fifth wire and the sixth wire cross each other.

11. An electronic device comprising a pixel, the pixel comprising:
a photodiode;
a first wire electrically connected to an anode of the photodiode;
a second wire electrically connected to the first wire;
a first transistor;
a second transistor; and
a third transistor,
wherein a gate of the first transistor is electrically connected to a third wire,
wherein one of a source and a drain of the first transistor is electrically connected to a cathode of the photodiode,
wherein the other of the source and the drain of the first transistor is electrically connected to a fourth wire,
wherein a gate of the second transistor is electrically connected to the fourth wire,
wherein one of a source and a drain of the second transistor is electrically connected to a fifth wire,
wherein a gate of the third transistor is electrically connected to a sixth wire,
wherein one of a source and a drain of the third transistor is electrically connected to the other of the source and the drain of the second transistor,
wherein the other of the source and the drain of the third transistor is electrically connected to a seventh wire,
wherein, in a plan view, the fifth wire and the second wire cross each other,
wherein, in the plan view, the fifth wire and the third wire cross each other, and
wherein, in the plan view, the fifth wire and the sixth wire cross each other.

12. The electronic device according to claim 11, wherein, in a plan view, the fourth wire is positioned between the first wire and the fifth wire.

13. The electronic device according to claim 11, wherein, in a plan view, the first wire and the second wire cross each other.

* * * * *